US012721166B2

(12) United States Patent
Summerville et al.

(10) Patent No.: US 12,721,166 B2
(45) Date of Patent: Aug. 25, 2026

(54) CONTROLLING AN IRON SLURRY IN SEMICONDUCTOR ASSEMBLY

(71) Applicant: Lenovo (Singapore) Pte. Ltd., Singapore (SG)

(72) Inventors: Mark Summerville, Apex, NC (US); Thomas Annunziata, Raleigh, NC (US); Justin Michael Ringuette, Cary, NC (US); Mark Christopher Heidenfeldt, Apex, NC (US); Sandy Collins, Durham, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 363 days.

(21) Appl. No.: 18/447,793

(22) Filed: Aug. 10, 2023

(65) Prior Publication Data

US 2025/0054835 A1 Feb. 13, 2025

(51) Int. Cl.

*H10W 40/30* (2026.01)
*H10W 40/25* (2026.01)
*H10W 40/73* (2026.01)

(52) U.S. Cl.

CPC ......... *H10W 40/30* (2026.01); *H10W 40/255* (2026.01); *H10W 40/257* (2026.01); *H10W 40/73* (2026.01)

(58) Field of Classification Search

CPC ... H10W 40/257; H10W 40/30; H10W 40/73; H10W 40/255; H10W 40/70
USPC .............................................................. 438/3
See application file for complete search history.

(56) References Cited

U.S. PATENT DOCUMENTS 3,215,572 A * 11/1965 Papell .................... C06B 23/00 149/114
5,231,834 A * 8/1993 Burnett ................... F25B 21/00 505/891
10,030,896 B1 * 7/2018 Dariavach .............. F25B 21/00
2020/0126699 A1 * 4/2020 Ghasemi ................ H01F 41/24
2024/0200281 A1 * 6/2024 Lounsbery ............. B60L 50/66
2025/0054833 A1 2/2025 Summerville et al.

* cited by examiner

*Primary Examiner* — Moazzam Hossain

(74) *Attorney, Agent, or Firm* — Schwegman Lundberg & Woessner, P.A.

(57) ABSTRACT

A substrate for electronic circuitry includes at least one magnet and a ferromagnetic liquid positioned in proximity to the one or more magnets. In an embodiment, the ferromagnetic liquid includes iron and gallium.

7 Claims, 3 Drawing Sheets

CONTROLLING AN IRON SLURRY IN SEMICONDUCTOR ASSEMBLY

TECHNICAL FIELD

Embodiments described herein generally relate to semiconductor assembly in computers or other electronics, and in an embodiment, but not by way of limitation, controlling an iron slurry in connection with semiconductor assembly.

BACKGROUND

Galinstan is a brand name for an alloy composed of gallium, indium and tin that is used extensively in semiconductor assembly. It is composed of 68.5% Ga, 21.5% In, and 10.0% Sn (by weight), it melts at −19° C. (−2° F.), and is thus liquid at room temperature. However, it is not a eutectic alloy but a near eutectic alloy. In scientific literature, Galinstan is also used as an acronym denoting the eutectic composition of the alloy of Ga—In—Sn, which melts at around +11° C. (52° F.). The composition of both alloys is roughly the same, although Galinstan, a company's commercial technical product, likely has added flux to improve flowability, to reduce melting temperature, and to reduce surface tension. Thus, the physical properties of the Galinstan and the pure eutectic alloy EGaInSn differ slightly. Due to the low toxicity and low reactivity of its component metals, in many applications, Galinstan has replaced the toxic liquid mercury or the reactive NaK (sodium-potassium) alloy.

When using Galinstan in the assembly of semiconductors, it is difficult to apply to a printed circuit board (PCB). In some cases, the application of Galinstan causes the processor and system board to short circuit. Also, thermal cycling may result in some Galinstan escaping the interface between the heat sink and the chip, which wreaks havoc with processor pins and circuit boards. Additionally, Galinstan can be corrosive to metal, so unprotected aluminum heat sinks cannot be used with it. Also, coatings and dams are used to protect and block free Galinstan from moving around on a circuit board.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings.

DETAILED DESCRIPTION

In an embodiment, a slurry of iron powder with Galinstan in a magnetic field raises the viscosity of a slurry, thereby helping to contain the Galinstan when fabricating semiconductors.

Iron has two and a half times the thermal conductivity of Galinstan, so it directly improves the thermal interface in comparison with Galinstan alone. Iron magnets are embedded in a heat sink to keep the iron-Galinstan slurry where desired and to reduce the tendency to escape the interface. In another embodiment, the magnets are placed around the heat sink and serve as a barrier. This method of containment still allows thermal expansion and contraction at the interface. In an embodiment, Neodymium magnets are used and these cause no interference with normal computer operation. In another embodiment, the magnets are placed under the processor and in order to protect the plane of the processor from penetration by the Galinstan iron slurry.

Figure 1:
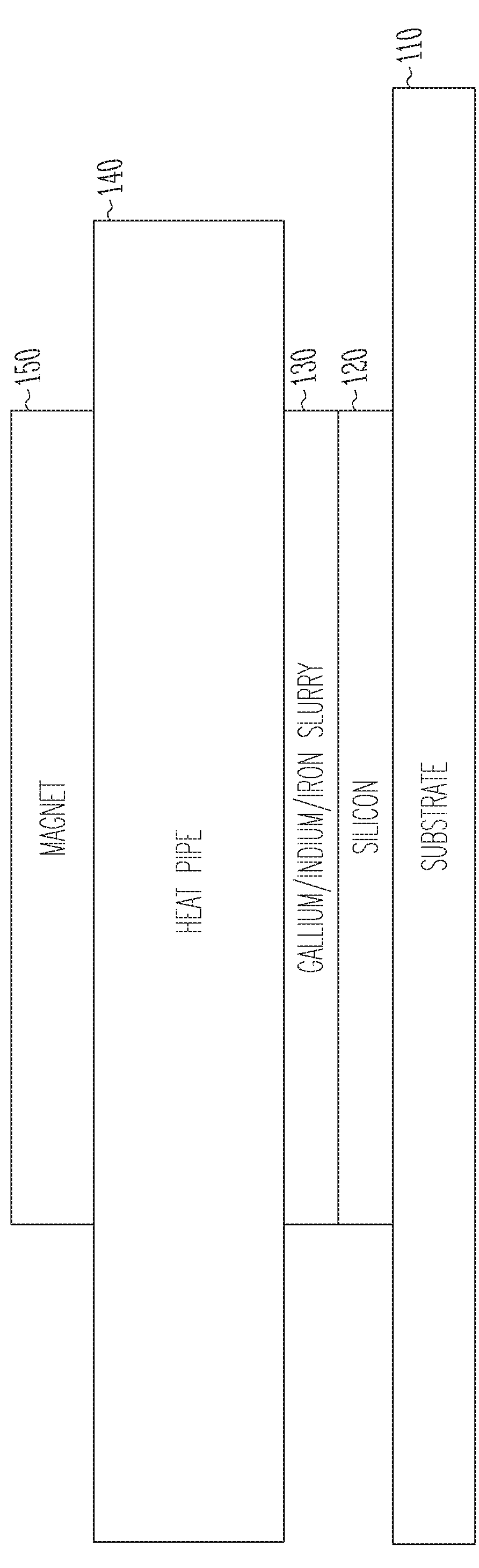
FIG. 1 illustrates an embodiment of a substrate, electronic circuitry, a magnet, and a ferromagnetic slurry.

FIG. 1 illustrates an example embodiment of a system 100 for controlling an iron slurry in semiconductor assembly. Silicon 120 is deposited on a substrate 110. In an embodiment, the substrate is a printed circuit board (PCB). A ferromagnetic liquid or slurry 130 is placed on the silicon 120. In an embodiment, the ferromagnetic slurry includes one or more of iron, indium and gallium. The iron can be in the form of an iron powder. A heat sink or heat pipe 140 is positioned on the ferromagnetic slurry 130, and a magnet 150 is positioned on the heat sink 140.

In another embodiment, the magnet 140 is embedded in the heat pip or heat sink 140. In another embodiment, the magnet 140 can be positioned below the silicon 120. As noted above, and as further detailed in FIGS. 2 and 3, this arrangement allows for controlling the placement of the iron slurry on a semiconductor chip.

Figure 2:
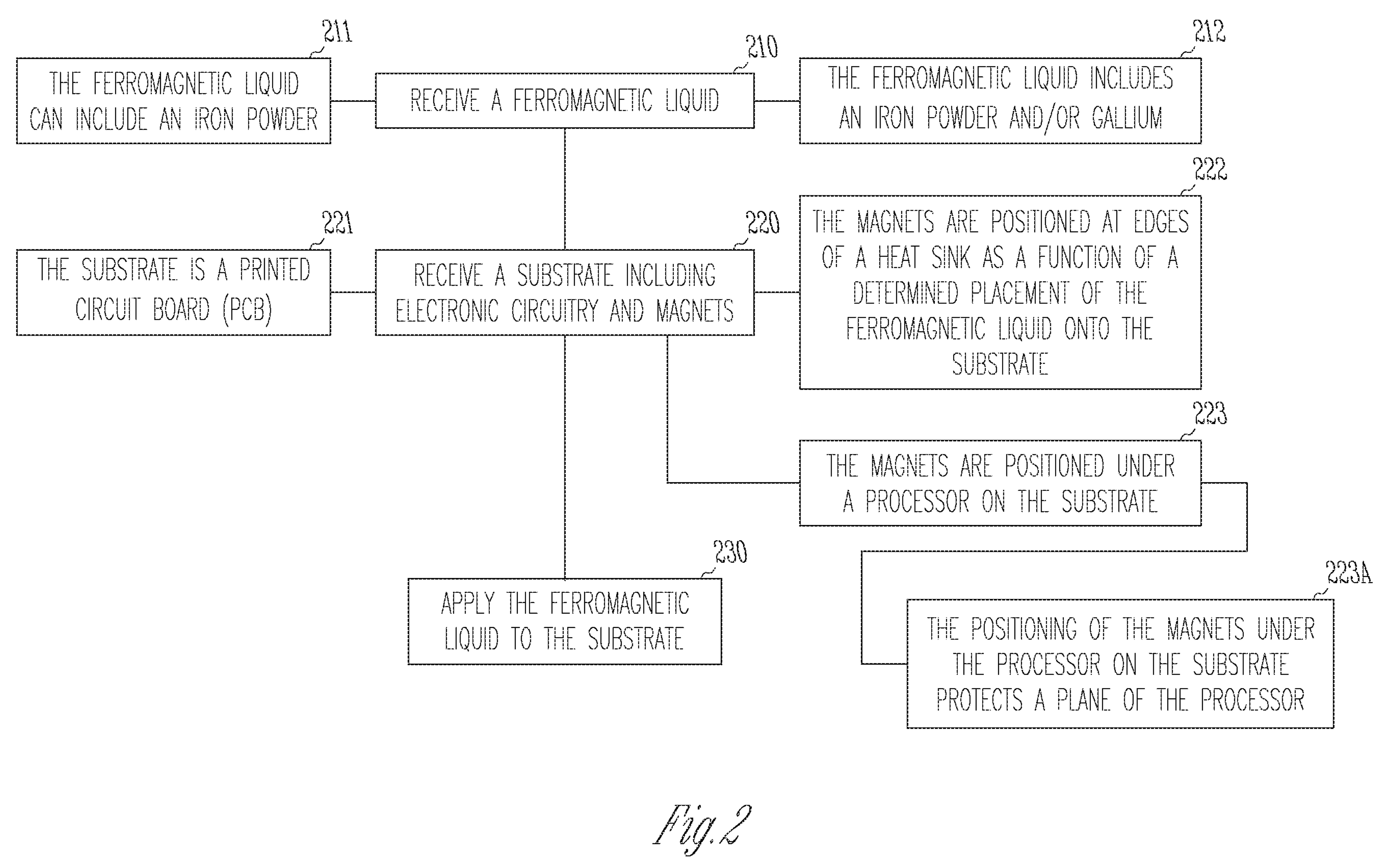
FIG. 2 illustrates an embodiment of a process of applying a ferromagnetic slurry to a semiconductor chip.
Figure 3:
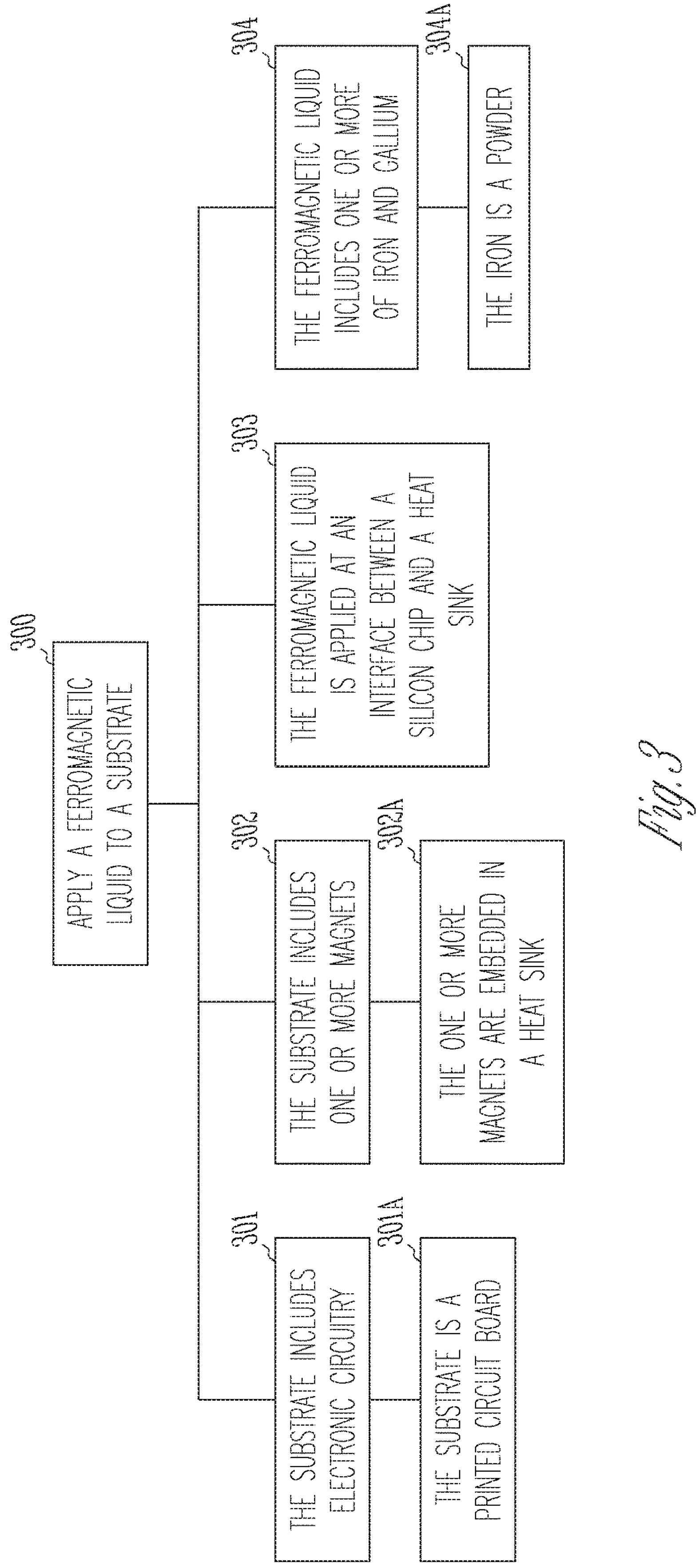
FIG. 3 illustrates another process of applying a ferromagnetic slurry to a semiconductor chip.

FIGS. 2 and 3 illustrate example embodiments of a system and process for controlling the application of a ferromagnetic slurry to a substrate. FIGS. 2 and 3 include a number of process and feature blocks 210-230 and 300-304A respectively. Though arranged substantially serially in the example of FIGS. 2 and 3, other examples may reorder the blocks, omit one or more blocks, and/or execute two or more blocks in parallel using multiple processors or a single processor organized as two or more virtual machines or sub-processors.

Referring now specifically to FIG. 2, at 210, a ferromagnetic liquid is received, acquired and/or secured, and at 220, a substrate is received, acquired and/or secured. The ferromagnetic liquid can include an iron powder (211). The iron powder raises a viscosity of the ferromagnetic liquid in the presence of a magnetic field. The ferromagnetic liquid can include one or more of an iron powder and gallium (212). The substrate includes electronic circuitry and one or more magnets. In a particular embodiment, the substrate is a printed circuit board (PCB) (221). The one or more magnets can be positioned at one or more edges of a heat sink as a function of a determined placement of the ferromagnetic liquid onto the substrate (222). The one or more magnets can be positioned under a processor on the substrate (223). The positioning of the one or more magnets under the processor on the substrate protects a plane of the processor (223A). At 230, the ferromagnetic liquid is applied to the substrate.

Referring now specifically to FIG. 3, at 300, a ferromagnetic liquid is applied to a substrate. The substrate includes electronic circuitry (301), and in a particular embodiment the substrate is a printed circuit board (301A). As indicated at 302, the substrate includes one or more magnets, and as further indicated at 302A, the one or more magnets can be embedded in a heat sink. The ferromagnetic liquid is applied at an interface between a silicon chip and a heat sink (303). In an embodiment, the ferromagnetic liquid includes one or more of iron and gallium (304). As indicated at 304A, the iron can be a powder. The iron powder increases the viscosity of the ferromagnetic liquid in the presence of a magnetic field.

The above detailed description includes references to the accompanying drawings, which form a part of the detailed description. The drawings show, by way of illustration, specific embodiments that may be practiced. These embodiments are also referred to herein as "examples." Such examples may include elements in addition to those shown or described. However, also contemplated are examples that include the elements shown or described. Moreover, also contemplated are examples using any combination or permutation of those elements shown or described (or one or more aspects thereof), either with respect to a particular example (or one or more aspects thereof), or with respect to other examples (or one or more aspects thereof) shown or described herein.

Publications, patents, and patent documents referred to in this document are incorporated by reference herein in their entirety, as though individually incorporated by reference. In the event of inconsistent usages between this document and those documents so incorporated by reference, the usage in the incorporated reference(s) are supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to suggest a numerical order for their objects.

The above description is intended to be illustrative, and not restrictive. For example, the above-described examples (or one or more aspects thereof) may be used in combination with others. Other embodiments may be used, such as by one of ordinary skill in the art upon reviewing the above description. The Abstract is to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. However, the claims may not set forth every feature disclosed herein as embodiments may feature a subset of said features. Further, embodiments may include fewer features than those disclosed in a particular example. Thus, the following claims are hereby incorporated into the Detailed Description, with a claim standing on its own as a separate embodiment. The scope of the embodiments disclosed herein is to be determined with reference to the appended claims, along with the full scope of equivalents to which such claims are entitled.

EXAMPLES

Example No. 1 is a substrate for electronic circuitry comprising one or more magnets; and a ferromagnetic liquid positioned in proximity to the one or more magnets.

Example No. 2 includes all the features of Example No. 1, and optionally includes a substrate the substrate comprises a printed circuit board (PCB).

Example No. 3 includes all the features of Example Nos. 1-2, and optionally includes a substrate wherein the ferromagnetic liquid is positioned at an interface between a silicon chip and a heat sink.

Example No. 4 includes all the features of Example Nos. 1-3, and optionally includes a substrate wherein the ferromagnetic liquid comprises one or more of iron and gallium.

Example No. 5 includes all the features of Example Nos. 1-4, and optionally includes a substrate wherein the iron comprises an iron powder.

Example No. 6 includes all the features of Example Nos. 1-5, and optionally includes a substrate wherein the one or more magnets are embedded in a heat sink.

Example No. 7 includes all the features of Example Nos. 1-6, and optionally includes a substrate wherein the magnet is positioned below a silicon chip.

Example No. 8 is a process comprising receiving a ferromagnetic liquid; receiving a substrate, the substrate comprising electronic circuitry and one or more magnets; and applying the ferromagnetic liquid to the substrate.

Example No. 9 includes all the features of Example No. 8, and optionally includes a process wherein the ferromagnetic liquid comprises an iron powder, and wherein the iron powder raises a viscosity of the ferromagnetic liquid.

Example No. 10 includes all the features of Example Nos. 8-9, and optionally includes a process wherein the one or more magnets are positioned at one or more edges of a heat sink as a function of a determined placement of the ferromagnetic liquid onto the substrate.

Example No. 11 includes all the features of Example Nos. 8-10, and optionally includes a process wherein the one or more magnets are positioned under a processor on the substrate.

Example No. 12 includes all the features of Example Nos. 8-11, and optionally includes a process wherein the positioning of the one or more magnets under the processor on the substrate protects a plane of the processor.

Example No. 13 includes all the features of Example Nos. 8-12, and optionally includes a process wherein the ferromagnetic liquid comprises one or more of an iron powder and gallium.

Example No. 14 includes all the features of Example Nos. 8-13, and optionally includes a process wherein the substrate comprises a printed circuit board (PCB).

Example No. 15 is a process comprising applying a ferromagnetic liquid to a substrate; wherein the substrate comprises electronic circuitry; and wherein the substrate comprises one or more magnets.

Example No. 16 includes all the features of Example No. 15, and optionally includes a process wherein the substrate comprises a printed circuit board (PCB).

Example No. 17 includes all the features of Example Nos. 15-16, and optionally includes a process wherein the ferromagnetic liquid is applied at an interface between a silicon chip and a heat sink.

Example No. 18 includes all the features of Example Nos. 15-17, and optionally includes a process wherein the ferromagnetic liquid comprises one or more of iron and gallium.

Example No. 19 includes all the features of Example Nos. 15-18, and optionally includes a process wherein the iron comprises a powder, and the iron powder increases the viscosity of the ferromagnetic liquid in the presence of a magnetic field.

Example No. 20 includes all the features of Example Nos. 15-19, and optionally includes a process wherein the one or more magnets are embedded in a heat sink.

The invention claimed is:

1. A substrate comprising:

electronic circuitry positioned on the substrate;

one or more magnets positioned on the substrate; and a ferromagnetic liquid positioned in proximity to the one or more magnets;

wherein a magnetic field of the one or more magnets raises a viscosity of the ferromagnetic liquid, thereby maintaining the ferromagnetic liquid at a preselected position on the substrate for the electronic circuitry; and wherein the electronic circuitry comprises a semiconductor.

2. The substrate of claim 1, wherein the substrate comprises a printed circuit board (PCB).

3. The substrate of claim 1, wherein the ferromagnetic liquid is positioned at an interface between a silicon chip and a heat sink.

4. The substrate of claim 1, wherein the ferromagnetic liquid comprises one or more of iron and gallium.

5. The substrate of claim 4, wherein the iron comprises an iron powder.

6. The substrate of claim 1, wherein the one or more magnets are embedded in a heat sink.

7. The substrate of claim 6, wherein the magnet is positioned below a silicon chip.

* * * * *